United States Patent
Müller-Rissmann et al.

(10) Patent No.: US 6,466,382 B2
(45) Date of Patent: Oct. 15, 2002

(54) OPTICAL ARRANGEMENT

(75) Inventors: Werner Müller-Rissmann, Oberkochen; Hubert Holderer, Königsbronn; Rudolf Von Bünau, Essingen; Christian Wagner, Aalen; Jochen Becker; Stefan Xalter, both of Oberkochen; Wolfgang Hummel, Schwäbach Gmänd, all of (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/751,132

(22) Filed: Dec. 29, 2000

(65) Prior Publication Data

US 2002/0126400 A1 Sep. 12, 2002

(30) Foreign Application Priority Data

Dec. 29, 1999 (DE) .......................... 199 63 588

(51) Int. Cl.$^7$ .............................. G02B 7/02; G02B 27/54
(52) U.S. Cl. .......................................... 359/820; 355/70
(58) Field of Search ................................. 359/820, 642; 351/163, 165, 166; 355/67, 70

(56) References Cited

U.S. PATENT DOCUMENTS 5,883,704 A    3/1999 Nishi et al. .................. 355/67
6,208,791 B1 *  3/2001 Bischel et al. ............... 385/129

FOREIGN PATENT DOCUMENTS

DE    A 198 07 094    8/1999
EP    B-0 532 236     7/1997

* cited by examiner

Primary Examiner—Ricky Mack
(74) Attorney, Agent, or Firm—Factor & Partners

(57) ABSTRACT

An optical arrangement, in particular a projection exposure system for microlithography, has, in particular, a slit-shaped image field or a non-rotational-symmetric illumination. As a result, an optical element (101) is exposed in a non-rotational-symmetric manner to the radiation of the light source (110, 111, 112). The optical element (101) has an absorbing coating (104, 105). The absorption of the coating (104, 105) is distributed in such a manner that it is non-rotation-symmetrical in a manner that is at least approximately complementary to the intensity distribution of the exposure to the radiation (107, 108, 109) of the light source (110, 111, 112). As a result of the energy absorbed in the coating (104, 105), an additional heating of the optical element (101) takes place that results in a better non-rotational-symmetric temperature distribution and, consequently, a compensation for light-induced imaging errors.

10 Claims, 2 Drawing Sheets

OPTICAL ARRANGEMENT

BACKGROUND OF THE INVENTION

The invention relates to an optical arrangement, in particular a projection exposure system for microlithography, in particular having slit-shaped illumination, having at least one light source that emits radiation and an optical element that is heated by exposure to the radiation, wherein the optical element is exposed to the emitted radiation of the light source with non-rotational-symmetric intensity distribution.

The imaging quality of such an optical arrangement is often reduced by non-rotational-symmetric imaging errors. Such imaging errors arise, for example, not only as a result of non-rotational-symmetric light-induced heating of the optical element, but also as a result of other light-induced effects, such as, for example, "compaction", that result in a corresponding non-rotation-symmetrical expansion or refractive-index distribution in the optical element.

Given high requirements imposed on the imaging quality, such as those demanded, in particular, in projection exposure methods in microlithography, the light-induced imaging errors described cannot be tolerated.

From the generic EP 0 678 768 A2, it is known to strive for an improvement in the imaging properties by symmetrizing or homogenizing the temperature distribution by an additional heating. In this case, the additional heating takes place actively by means of a plurality of heating elements that are thermally coupled to the circumferential area of a lens. Such heating of the lens has the disadvantage that the circumferential area of the lens has to be heated relatively strongly to achieve, despite the thermal conduction properties of the lens material, which are as a rule poor, the desired symmetrization or homogenization of the temperature distribution in the central region of the lens, which is most relevant for the imaging properties. A strong heating of the circumferential region of the lens results, however, in a risk of damage to the lens and/or the lens mounting as a result of thermal stresses.

Because of the relatively large spacing between the circumferential region and the central region, which is modified by the radiation of a light source serving for projection, a controlled structured modifying of the temperature distribution in the vicinity of the central region is, in addition virtually scarcely possible through heating the circumferential region.

In the likewise generic EP 0 823 662 A2, optical elements are additionally heated in order to compensate for the projection light-induced imaging errors by coupling in additional light sources that heat the optical elements by absorption at those points where they are not irradiated by the projection light. Since the heating power due to the additional light sources have to be comparable to those of the projection light source to symmetrize or homogenize the temperature distribution, for the additional light sources, either light powers of the order of magnitude of those of the projection light source are necessary or the additional light sources must operate in wavelength ranges that are more heavily absorbed by the material of the optical elements. In both cases, expensive additional light sources are necessary. In the first case, light sources having high power are necessary, and in the second case, light sources having a wavelength are necessary that are not available at low cost.

BRIEF SUMMARY OF THE INVENTION

The object of a the present invention is therefore to develop an optical arrangement of the type mentioned at the outset in such a way that a better symmetrization or homogenization of the temperature distribution in the optical element can be achieved by simple means.

This object is achieved, according to the invention, in that
a) the optical element has an absorbing coating having a spatial distribution such that
b) the absorption of the coating is non-rotational-symmetric in an at least approximately complementary manner to the intensity distribution of the exposure to the radiation of the light source.

Such an absorbing coating results in an increased flexibility if a specified additional heating of the lens is to be established by means of the light absorption. New degrees of freedom, such as the absorption coefficient and the form of the absorbing coating, are then available for modifying the distribution of the additional heating.

Preferably, the absorbing coating comprises at least two portions between which there remains a non-absorbingly coated region whose dimension transversely to the axis of the radiation is smaller in at least one direction than the cross section of the radiation measured in the same direction. As a result, the additional heating can be brought about by means of the absorption of the projection light itself. For this purpose, a smaller proportion of the projection light is absorbed in the coating and results in the desired symmetrization or homogenization of the temperature distribution in the optical element by means of thermal conduction in the coating and thermal coupling to the optical element. The proportion of projection light that is absorbed in the coating is in this case so small that the projection quality is virtually unaffected thereby.

The absorbing coating has an absorptive power, varying over its surface, for wavelengths of the radiation of the light source. As a result, a more substantial adjustment of the spatial distribution of the additional heating is possible by means of the light absorption in the coating in order to symmetrize or homogenize the entire temperature distribution of the optical element.

Such an absorptive power varying over the surface can be achieved, for example, as follows:

The absorbing coating may vary in its layer thickness. This makes possible coating with uniform material whose absorptive power nevertheless varies over the surface.

Alternatively or additionally, the absorbing coating varies spatially in its absorption coefficient. As a result, either a coating is possible that has an absorptive power varying over the surface with constant layer thickness, which is advantageous for the production of anti-reflection layers, or an additional degree of freedom is provided for the production of coatings varying in absorption over their surface. In the latter case, relatively complex absorption structures can also be produced. Such a variation in the absorption coefficient can be achieved, for example, by controlled doping of the absorption coating.

Preferably, the absorbing coating has the highest absorptive power in the region that is nearest the centre of the surface of the optical element exposed to the radiation. Additional heating necessary for the symmetrization or homogenization then takes place in the vicinity of the central region of the optical element, which is the most strongly heated by the projection light, so that at that point a strong additional heating can take place in a controlled manner for the purpose of symmetrization or homogenization. An unnecessary heating of more remote regions in order additionally to heat the region in the vicinity of the central region heated by the projection light by thermal conduction is superfluous.

In a refinement of the invention, the light source has a projection light source and a compensating light source, wherein the radiation of the compensating light source is directed at the absorbing coating. The absorption coefficient of the coating and the compensating light source can be matched to one another in such a way that compensating light sources having very low light powers and a standard emission wavelength can be used that are correspondingly less expensive and less complicated than in the subject matter of the abovementioned EP 0 823 662 A2. Thus, the absorption coefficient of the coating can be adapted, for example, to the emission wavelength of the known inexpensive light sources, such as laser diodes. An additional control of the temperature distribution is possible via the surfaces of the optical element exposed to compensating light and via the distribution of the light power over the exposed surfaces. Optionally, the additional heating can also be adapted to the requirements by adjusting the size and the position of the surface exposed to the compensating light. This is done by suitable alignment of the compensating light sources.

The spatial distribution of the absorbing coating may be such that optical image errors of at least one other optical element are compensated for by the non-rotational-symmetric absorption of the radiation of the light source in an optical element. Such an overcompensation makes possible compensation for imaging errors of a system of optical elements. Under these circumstances, only one of said optical elements has to have an absorbing coating.

BRIEF DESCRIPTION OF THE DRAWINGS

Exemplary embodiments of the invention are explained in greater detail below by reference to the drawing; in the drawing.

DETAILED DESCRIPTION OF THE INVENTION

Figure 1:
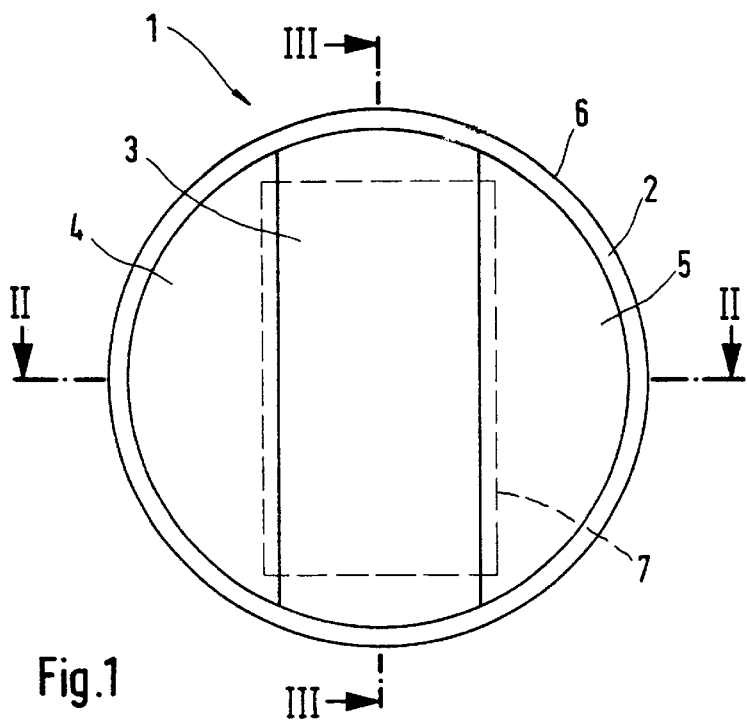
FIG. 1 shows a plan view of a lens coated according to the invention.
Figure 3:
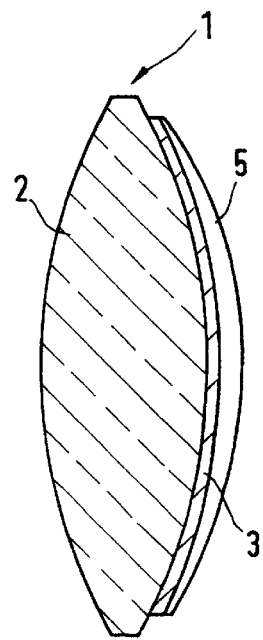
FIG. 3 shows a section along the line III—III of FIG. 1.
Figure 2:
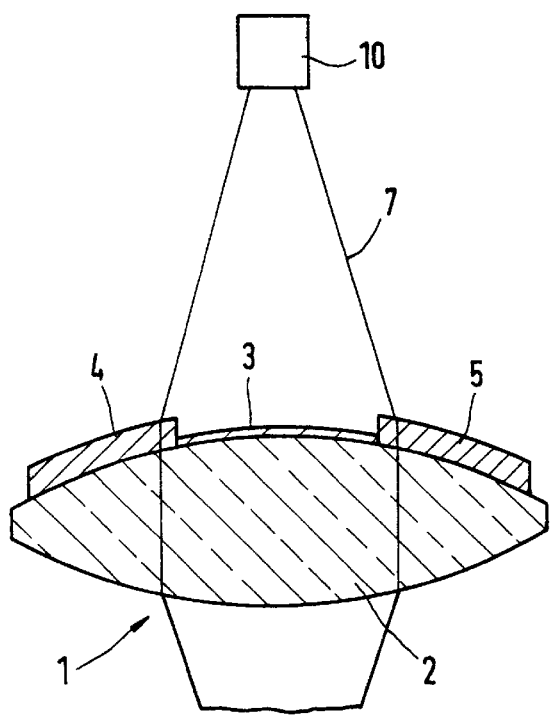
FIG. 2 shows a section along the line II—II of FIG. 1, which figure additionally shows peripheral rays of a light beam acting on the lens.

The lens 1 shown in FIGS. 1 to 3 is part of an optical arrangement for a projection exposure system for microlithography.

A main body 2 of the lens 1 is composed of a material, for example quartz glass or $CaF_2$, that has good transparency for the wavelength range of the radiation of a projection light source 10. The main body 2 is coated in three parts on an optical surface.

Two absorption layer segments 4, 5 are adjacent to a central anti-reflection layer strip 3 in such a way that they jointly cover one of the optical surfaces of the main body 2 except for a free circumferential edge region 6 that is occupied in the assembled state of the lens 1 by a mounting (not shown). Neither the layer thicknesses of the anti-reflection layer strip 3 and of the absorption layer segments 4, 5 nor the ratio of these layer thicknesses to one another are shown to true scale in the drawing.

The reflection of the lens 1 is minimized in the region of the wavelength of the radiation of the projection light source 10 by the anti-reflection layer strip 3.

The layer thickness of the anti-reflection layer strip 3 is constant over its entire surface. The absorption layer segments 4, 5, on the other hand, have a continuous variation in their layer thickness. In the region of that meridianal of the lens 1 (sectional plane of FIG. 2) that extends perpendicularly to the anti-reflection layer strip 3, the layer thickness of the absorption layer segments 4, 5 is greatest, whereas it continuously decreases towards the edge of the main body 2 in the direction perpendicular thereto (parallel to the sectional plane of FIG. 3).

Within the framework of the microlithography process, the lens 1 is irradiated with a rectangular projection light beam 7 of the projection light source 10. The cross-sectional area of the projection light beam 7 is shown by broken lines in the region where it passes through the lens 1 in FIG. 1 and has an aspect ratio of the long side to the narrow side of approximately 2:1.

In the light exposure shown in FIG. 1, the narrow side of the projection light beam 7 is wider than the width of the anti-reflection layer strip 3, with the result that the edge regions of the projection light beam 7 pass through the absorption layer segments 4, 5.

The coated lens 1 functions as follows:

Because of the residual absorption of the material of the main body 2 in the region of the wavelength of the projection light beam 7, the lens 1 is heated by the projection light beam 7, which has a rectangular cross-sectional area in the region of the lens 1. This heating initially has the symmetry of the light channel of the projection light beam 7 in the main body 2. It results both in a thermal expansion of the material and in a refractive-index change and therefore, due to the changed refraction properties, in a change in the imaging properties of the lens 1.

The object of the absorption of the radiation of the projection light bundle 7 in the absorption layer segments 4, 5 is to achieve, through a resultant additional heating in a manner complementary to the heating due to the projection light beam 7, a symmetrization or a specified form of the temperature distribution in the lens 1 that results in well controllable imaging properties of the projection exposure system.

With the light exposure, shown in FIG. 1, of the lens 1 to the projection light beam 7, the additional heating takes place in those regions in which the projection light beam 7 passes through the absorption layer segments 4, 5. Since the material of the absorption layer segments 4, 5 has a spatially constant absorption coefficient, their absolute absorption is highest in the region of the sectional plane of FIG. 2 in which the layer thickness of the absorption layer segments 4, 5 is greatest. The strongest additional heating of the main body 2 therefore takes place there as a result of the absorbed energy in the absorption layer segments 4, 5.

This additionally absorbed energy distributes itself in the absorption layer segments 4, 5 as a result of thermal conduction. Heating of those regions of the main body 2 that are not exposed to the projection light beam 7 is produced in the vicinity of the long sides of the cross-sectional surface of the projection light beam 7 as a result of the thermal coupling of the absorption layer segments 4, 5 to the main body 2.

In this connection, the layer thickness distribution of the absorption layer segments 4, 5 is chosen in such a way that, as a result of the two components of the heating, that is to say the residual absorption in the main body 2, on the one hand, and the absorption in the absorption layer segments 4, 5, on the other, a temperature distribution in the main body 2 is produced which approaches the desired rotational symmetry more closely than the temperature distribution that would be established without absorption layer segments 4, 5.

A variation in the absorption in the absorption layer segments 4, 5 can be achieved not only by a layer thickness variation, but also by a spatial variation in the absorption coefficient of the material of the absorption layer segments 4, 5. For this purpose, for example, the absorption layer segments 4, 5 are appropriately doped in those regions in which a higher absorption is desired. In that case, the absorption layer segments 4, 5 may have a constant layer thickness over their surface (not shown).

The optical surface of the lens 1 situated opposite the three-part coating described has, as a rule, an anti-reflection coating (not shown). Of course, both transmission surfaces may also have the three-part coating.

A contribution to the symmetrization of the temperature distribution in the main body 2 in the case of light exposure to a projection light beam can also be achieved by an alternative configuration of the surfaces of the absorption layer segments.

Instead of a symmetrization of the temperature distribution in the main body 2, a controlled overcompensation of the imaging behaviour of the lens 1 can also be achieved in that case with the aid of the absorption layer segments 4, 5. If, for example, the lens 1 is part of an optical arrangement comprising a plurality of adjacent lenses, the imaging error produced by the asymmetrical heating in the adjacent lenses can be compensated for by a controlled overcompensation of the imaging properties of the one lens 1. For this purpose, for example, an astigmatism in the main body 2 that corresponds to that astigmatism, rotated approximately through 90°, that would arise solely as a result of the heating of the other lenses in the optical arrangement by the residual absorption in the main bodies 2 is produced by the additional heating of the main body 2 of the one lens 1 by the absorption in the absorption layer segments 4, 5.

The use of the absorption layer segments described is not restricted to refractive optical elements, such as, for example, the lens 1. Reflective optical components, such as, for example, a mirror or a reflection grating, can also be provided with such absorption layer segments in order to achieve in that case a compensation for image errors through a controlled additional heating as a result of the absorption of radiation of a projection and/or a compensation light beam (cf. below).

Figure 4:
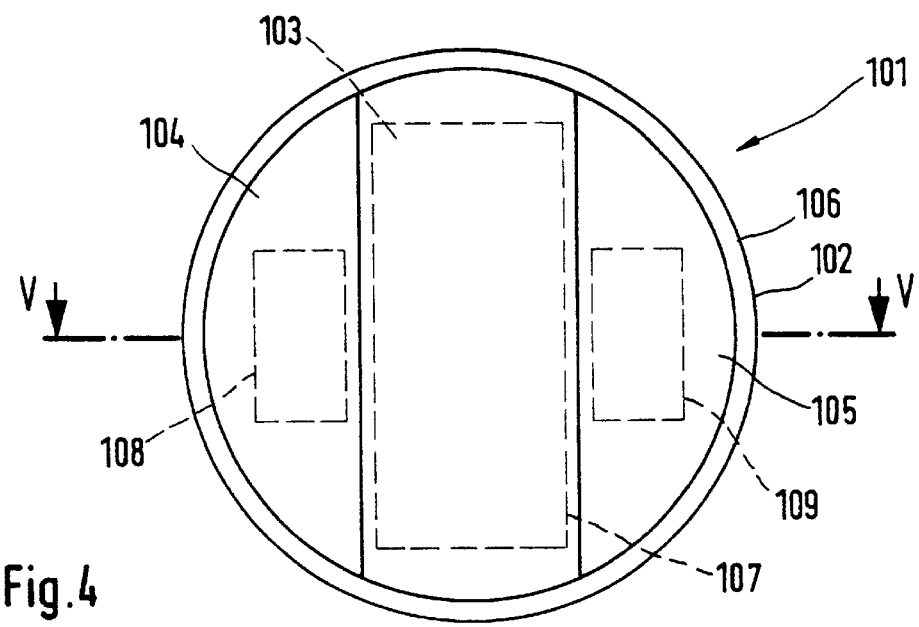
FIG. 4 shows the lens of FIGS. 1 to 3 with an alternative light exposure.
Figure 5:
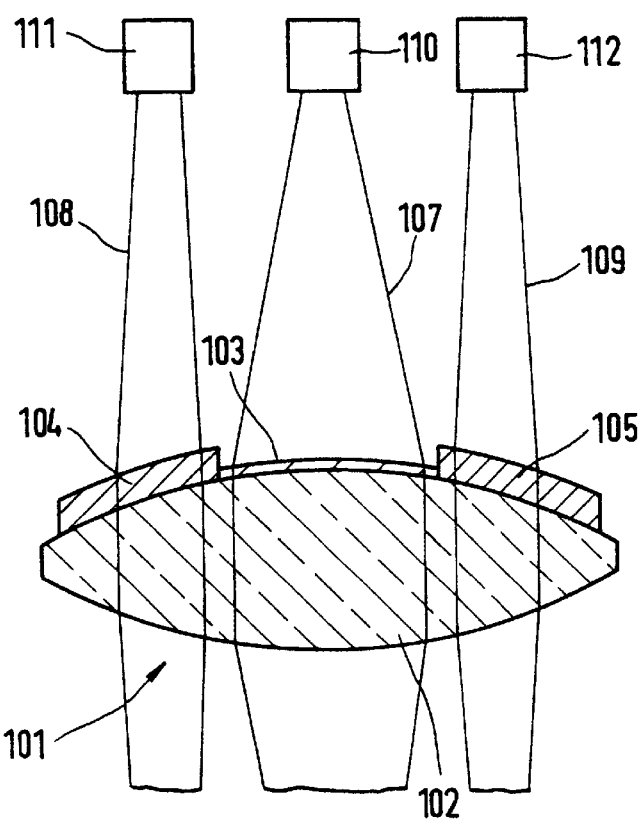
FIG. 5 shows a section along the line V—V of FIG. 4.

An alternative light exposure of a lens 101 having absorption layer segments 104, 105 is shown in FIGS. 4 and 5. Components that correspond to those in FIGS. 1 to 3 bear reference symbols increased by 100 and are not explained in detail yet again.

In FIG. 4, the entire cross-sectional area of the projection light beam 107 passing through the lens 101 is situated within the area of the anti-reflection light strip 103. The absorption layer segments 104, 105 are exposed to compensating light beams 108, 109 from compensating light sources 111, 112 of, for example, laser diodes.

In the case of the light exposure shown in FIG. 4, the additional heating for the purpose of symmetrizing the temperature distribution in the main body 102 takes place by the absorption of the radiation of the two compensating light beams 108, 109. The extent of the additional heating can in this case be adjusted, on the one hand, by means of the absorption of the absorption layer segments 104, 105 and, on the other hand, by means of the radiation power of the compensating light beams 108, 109. This adjustment takes place optionally in a controlled manner and as a function of the signals of a sensor (not shown) that monitors the imaging quality of the lens 1 or of the optical arrangement of the projection exposure system. Such a sensor may be a two-dimensional CCD array on which an image plane of the optical arrangement is imaged.

What is claimed is:

1. An optical arrangement, comprising a projection exposure system for microlithography, in particular having slit-shaped illumination, having at least one light source that emits radiation and an optical element that is heated by exposure to the radiation, wherein the optical element is exposed to the emitted radiation of the light source with non-rotational-symmetric intensity distribution; wherein
    a) the optical element (1; 101) has an absorbing coating (4, 5; 104, 105) having a spatial distribution such that
    b) the absorption of the coating (4, 5; 104, 105) is non-rotational-symmetric in an approximately complementary manner to the intensity distribution of the exposure to the radiation (7, 107, 108, 109) of the light source (10; 110, 111, 112).

2. The optical arrangement as claimed in claim 1, wherein the absorbing coating comprises at least two portions (4, 5) between which there remains a non-absorbingly coated region (3) whose dimension transversely to the axis of the radiation (7) is smaller in at least one direction than the cross section of the radiation (7) measured in the same direction.

3. The optical arrangement as claimed in claim 1, wherein the absorbing coating (4, 5; 104, 105) has an absorptive power, varying over its surface, for wavelengths of the radiation (7; 107, 108, 109) of the light source (10; 111, 112).

4. The optical arrangement as claimed in claim 3, wherein the absorbing coating (4, 5; 104, 105) varies in its layer thickness.

5. The optical arrangement as claimed in claim 3, wherein the absorbing coating varies spatially in its absorption coefficient.

6. The optical arrangement according to claim 3, wherein the absorbing coating (4, 5; 104, 105) has the highest absorptive power in the region that is nearest the centre of the surface of the optical element exposed to the radiation.

7. The optical arrangement according to claim 1, wherein the light source has a projection light source (110) and a compensating light source (111, 112), wherein the radiation (108, 109) of the compensating light source (111, 112) is directed at the absorbing coating (104, 105).

8. The optical arrangement according to claim 1, wherein a spatial distribution of the absorbing coating (104, 105) is such that optical image errors of at least one other optical element are compensated for by the non-rotational-symmetric absorption of the radiation (7; 107, 108, 109) of the light source (10; 110, 111, 112) in an optical element.

9. An optical arrangement, comprising: a projection exposure system for microlithography, in particular having slit-shaped illumination, having at least one light source that emits radiation and an optical element that is heated by exposure to the radiation, wherein the optical element is exposed to the emitted radiation of the light source with non-rotational-symmetric intensity distribution; wherein
    a) the optical element (1;101) has an absorbing coating (4, 5; 104, 105) having a spatial distribution such that
    b) the absorption of the coating (4, 5; 104, 105) is non-rotational-symmetric in a complementary manner to the intensity distribution of the exposure to the radiation (7, 107, 108, 109) of the light source (10; 110, 111, 112).

10. An optical arrangement, comprising: means for providing a slit-shaped illumination; and an absorbing coating having a spatial distribution such that the absorption of the coating is non-rotational-symmetric.

* * * * *